United States Patent
Roth et al.

(10) Patent No.: US 7,334,325 B2
(45) Date of Patent: Feb. 26, 2008

(54) APPARATUS AND METHOD FOR IMPROVING COUPLING ACROSS PLANE DISCONTINUITIES ON CIRCUIT BOARDS

(75) Inventors: Weston Roth, Hillsboro, OR (US); Jayne L. Mershon, Portland, OR (US); Xang Moua, Canby, OR (US); Jason A. Mix, Hillsboro, OR (US)

(73) Assignee: Intel Corporation, Santa Ana, CA (US)

( * ) Notice: Subject to any disclaimer, the term of this patent is extended or adjusted under 35 U.S.C. 154(b) by 268 days.

(21) Appl. No.: 10/990,740

(22) Filed: Nov. 16, 2004

(65) Prior Publication Data

US 2005/0082088 A1 Apr. 21, 2005

Related U.S. Application Data

(62) Division of application No. 10/329,188, filed on Dec. 23, 2002.

(51) Int. Cl.
*H01K 4/10* (2006.01)
(52) U.S. Cl. ............................. 29/852; 29/825; 29/846; 29/851; 333/236; 333/238
(58) Field of Classification Search .................. 29/825, 29/846, 851; 333/236, 238
See application file for complete search history.

(56) References Cited

U.S. PATENT DOCUMENTS

| | | | |
|---|---|---|---|
| 4,520,228 A | 5/1985 | Hoffmann | |
| 5,065,228 A * | 11/1991 | Foster et al. | 257/698 |
| 5,108,553 A * | 4/1992 | Foster et al. | 205/125 |
| 5,171,709 A * | 12/1992 | Donelon et al. | 427/595 |
| 5,182,230 A * | 1/1993 | Donelon et al. | 427/525 |
| 5,357,050 A | 10/1994 | Baran et al. | |
| 5,436,203 A * | 7/1995 | Lin | 29/841 |
| 5,734,270 A * | 3/1998 | Buchanan | 324/754 |
| 5,898,564 A * | 4/1999 | Mayer et al. | 361/508 |
| 6,219,255 B1 | 4/2001 | Teshome | |
| 6,349,038 B1 | 2/2002 | Hailey | |
| 6,392,898 B1 | 5/2002 | Asai et al. | |
| 6,727,774 B1 * | 4/2004 | Novak | 333/12 |
| 6,738,249 B1 * | 5/2004 | Anthony et al. | 361/117 |
| 6,779,262 B1 | 8/2004 | Gales et al. | |
| 6,825,743 B2 * | 11/2004 | Rumpf et al. | 333/238 |
| 7,047,515 B1 * | 5/2006 | Vitek et al. | 716/15 |
| 2002/0156538 A1 | 10/2002 | Chang | |

* cited by examiner

*Primary Examiner*—Carl J. Arbes
(74) *Attorney, Agent, or Firm*—Marger Johnson & McCollom, P.C.

(57) ABSTRACT

The invention relates to an apparatus and method for improving coupling across plane discontinuities on circuit boards. A circuit board includes a discontinuity, e.g., a split, slot, or cutout, formed on a voltage reference plane. A conductive layer overlies the discontinuity. The conductive layer has a first portion connected to the underlying reference plane and a second portion spanning the discontinuity. The first portion is connected to the reference plane using a slot or vias. And the conductive layer has a third portion extending over the reference plane but remaining disconnected from it. The conductive layer might be graphite or carbon black.

21 Claims, 4 Drawing Sheets

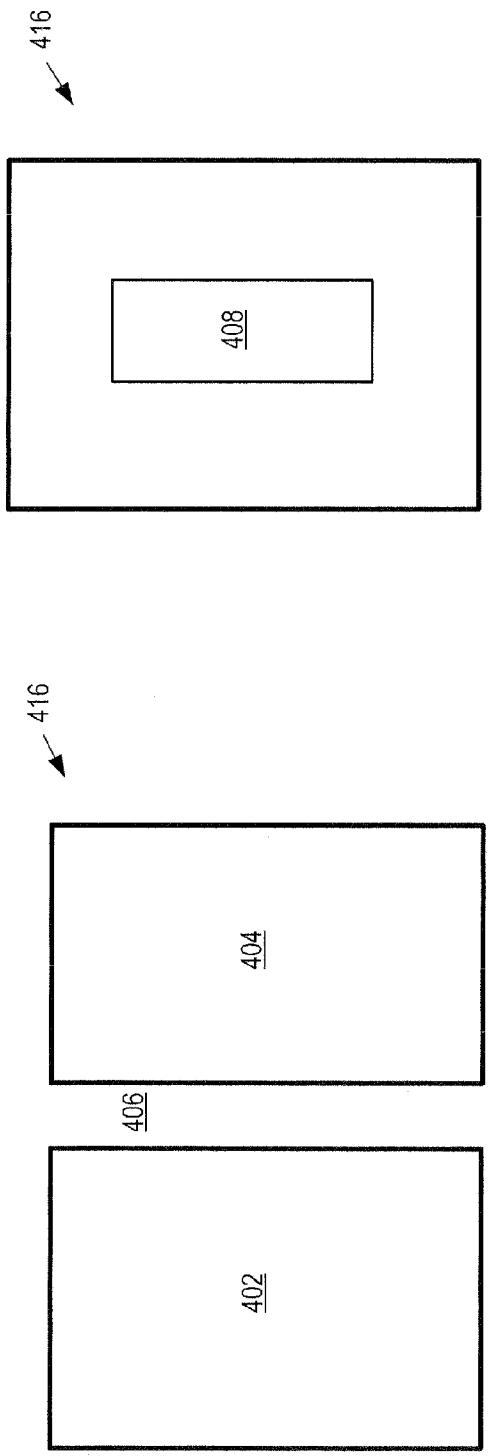
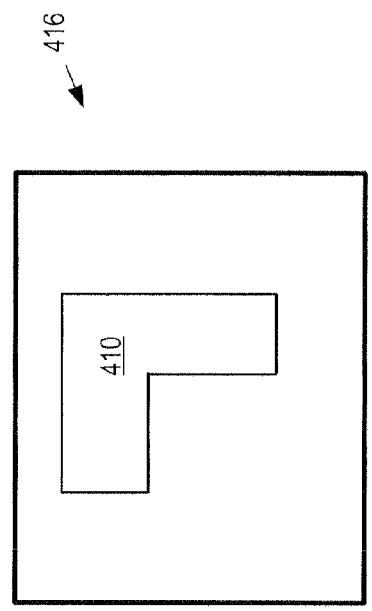
FIGURE 4A
FIGURE 4B
FIGURE 4C

APPARATUS AND METHOD FOR IMPROVING COUPLING ACROSS PLANE DISCONTINUITIES ON CIRCUIT BOARDS

This application is a divisional of prior U.S. Ser. No. 10/329,188, filed Dec. 23, 2002.

BACKGROUND OF THE INVENTION

1. Field of the Invention

The invention relates to circuit boards (CBs), e.g., printed circuit boards, imprinted boards, and any other support substrate. More particularly, to an apparatus and method for improving coupling between signals routed across plane discontinuities on CBs.

2. Description of the Related Art

CBs are typically manufactured with a plurality of layers, each layer being permanently affixed to an adjoining layer through a structural, non-conductive material. FIG. 1 is an example of a four layer CB 100. Referring to FIG. 1, the first and fourth layers 112 and 124, respectively, are signal trace layers on which signal lines are routed. The second and third layers 116 and 120, respectively, are voltage reference layers, e.g., the second layer 116 is a power layer and the third layer 120 is a ground layer. The power layer 116 and ground layer 120 are affixed to a core 118 comprised of a fiberglass mesh material such as FR4. The first signal layer 112 and the power layer 116 and the second signal layer 124 and the ground layer 120 each sandwich a pre impregnated epoxy material 114, commonly referred to as pre-preg.

Signal lines are primarily routed on the first and fourth layers 112 and 124, respectively. Oftentimes, signal lines must be routed from the first layer 112 to the fourth layer 124 through the reference layers 116 and 120. When this occurs, the power layer 116 and the ground layer 120 must be split, cutout, or slotted (the result is collectively termed a discontinuity) to avoid a short circuit between the signal lines being cross-routed and the reference layers. Signals routed around the cross-routed signal must necessarily be laid out across the discontinuity.

FIG. 2A is a cross sectional view of an exemplary CB 200 with a discontinuity 202. FIG. 2B is a top view of the CB 200. Referring to FIGS. 2A-B, the CB 200 includes a ground plane (or layer) 204 and voltage planes (or layers) 206 and 208. A discontinuity 202 exists between voltage planes 206 and 208. A signal 210 bridges or spans the discontinuity 202 as most clearly shown in FIG. 2B.

High-speed signals that span discontinuities in adjacent reference planes, like signal 210, generate electromagnetic (EM) radiation because of the electrical break caused by the plane discontinuity. This EM radiation adversely affects electromagnetic containment (EMC) and signal integrity (SI). For one, the discontinuity increases the electrical ground path increasing loop inductance. And the larger inductance might cause signal distortion and phase shifts.

To avoid these issues, CB designers avoid routing high-speed signals over discontinuities. But these constraints are often difficult to maintain as CB real estate shrinks or as signal density increases. Another way CB designers avoid these problems is to use stitching capacitors across discontinuities, e.g., stitching capacitor 212. The stitching capacitor 212 electrically couples the plane 208 to the plane 206 through vias 214. The stitching capacitor 212 provides alternating current (AC) coupling that reduces EM radiation at the discontinuity reducing, in turn, adverse EMC and SI effects. The addition of stitching capacitors, however, is costly. One stitching capacitor is required for each signal crossing a discontinuity. Thus, the CB component count increases, increasing cost. More components require additional CB real estate, also increasing cost.

Accordingly, a need remains for an apparatus and method of improving coupling across plane discontinuities on circuit boards.

BRIEF DESCRIPTION OF THE DRAWINGS

The foregoing and other objects, features, and advantages of the invention will become more readily apparent from the detailed description of an embodiment that references the following drawings.

FIGS. 4A-C are diagrams of the CB discontinuity shown in FIG. 3.

DETAILED DESCRIPTION OF THE PREFERRED EMBODIMENT

Figure 1:
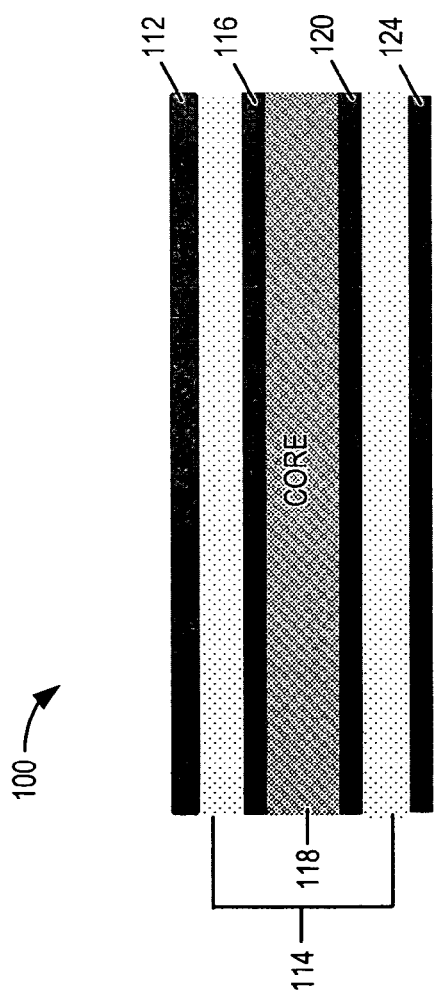
FIG. 1 is a cross sectional view of a CB.
Figure 3:
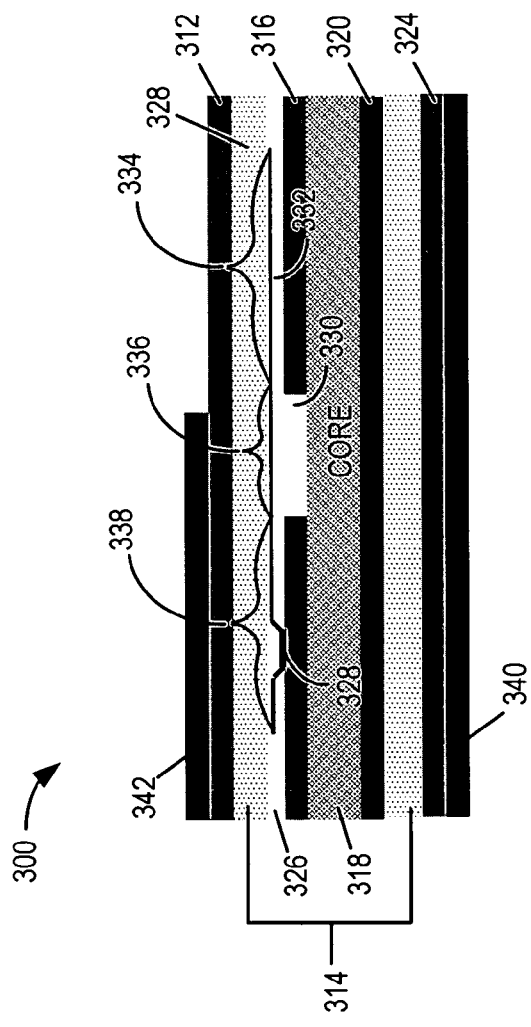
FIG. 3 is a cross sectional view of a CB according to the present invention.
Figure 2B:
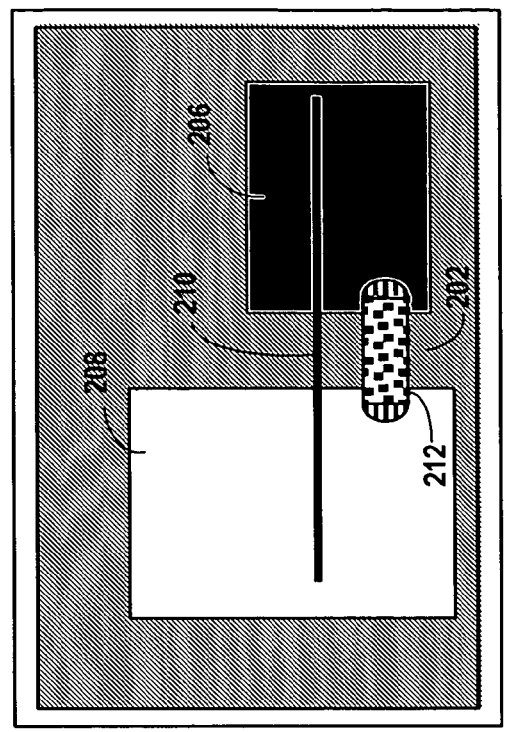
FIG. 2B a top view of the CB shown in FIG. 2A.
Figure 2A:
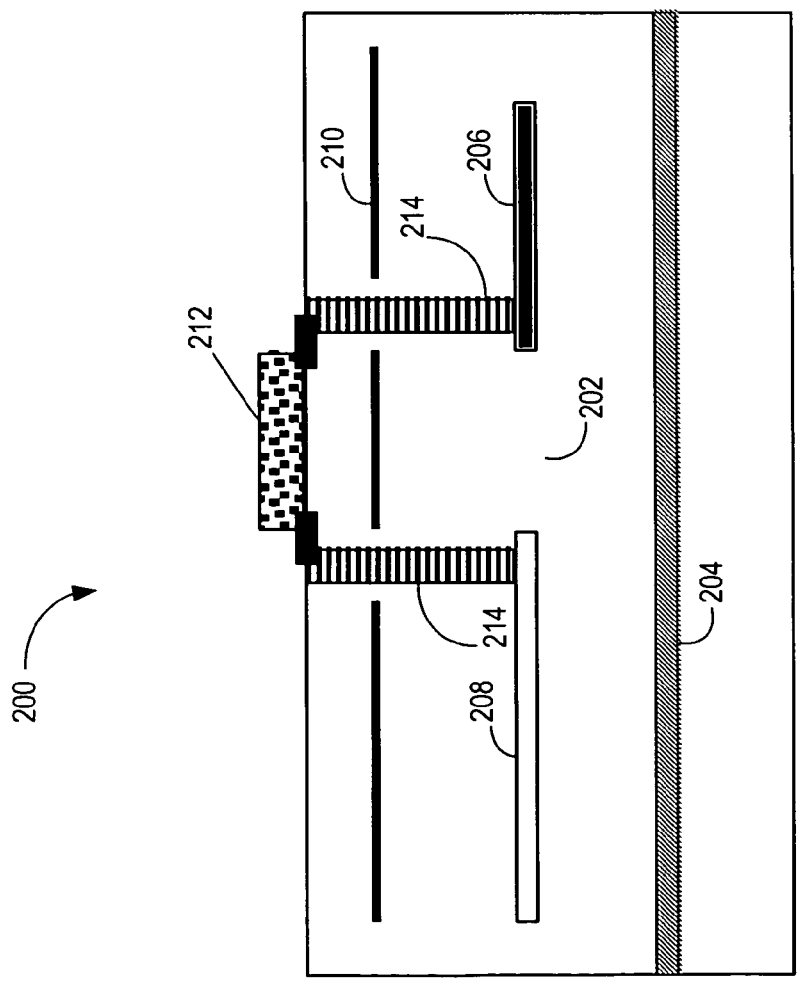
FIG. 2A is a cross sectional view of another CB.

FIG. 3 is a cross sectional view of a CB according to the present invention. For simplicity, the CB shown in FIG. 3 includes four layers, a ground layer 320, a voltage layer 316, and two signal trace layers 312 and 324. A person of reasonable skill in the art should recognize that the invention might be embodied in CBs having any number of layers.

Referring to FIG. 3, a CB 300 includes a core 318 comprised of a non-conductive material, e.g., FR4. The core 318 provides structural strength and rigidity to the CB 300. A person of reasonable skill in the art should recognize a variety of materials for CB cores.

A reference plane (or layer) 316 is formed on the core 318. A reference plane 320 is likewise formed on the core 318. The reference planes 316 and 320 might provide a ground (e.g., GND) or a predetermined power supply voltage (e.g., VCC) to signal traces routed on signal layers 312 and 324, as explained further below. The reference planes 316 and 320 might comprise 1-ounce copper. A person of reasonable skill in the art should recognize other suitable materials for the reference planes 316 and 320. A person of reasonable skill in the art should recognize well-known methods for forming the reference planes 316 and 320 on core 318, e.g., electroless or electroplating processes.

Discontinuities are formed in the reference planes, e.g., discontinuity 330 formed on voltage reference plane 316. A person of reasonable skill in the art should recognize well-known methods for forming discontinuities 330 in the reference plane 316, e.g., standard copper etching processes that chemically etch and define patterns, planes, lines, and the like on conductive layers such as reference plane 316.

Referring to FIGS. 3 and 4A-C, one embodiment of the discontinuity 330 is a split 406, that is, where a first portion 402 is separated from end to end from a second portion 404 of the reference plane 416. Another embodiment of the discontinuity 330 is as a slot 408 (FIG. 4B). Yet another embodiment of the discontinuity 330 is as a cutout 410 (FIG. 4C).

Referring to FIG. 3, discontinuities, e.g., discontinuity 330, in the reference planes 316 and 320 allow a signal to be cross-routed from a first signal layer 312 to a second signal layer 324 without being shorted through the reference planes 316 and 320. Although the discontinuity 330 is shown only on reference plane 316, a person of reasonable skill in the art should recognize that any number of discontinuities is possible in any number of reference planes, e.g., planes 316 and 320.

A dielectric barrier layer 326 is formed on the reference plane including the discontinuity, e.g., reference plane 316. The barrier layer 326 prevents electrical shorts across the discontinuity 330. The dielectric barrier layer 326 comprises a non-conductive epoxy material, e.g., 1060 pre-preg or a liquid curable epoxy. A person of reasonable skill in the art should recognize other suitable materials for the dielectric barrier layer 326. A person of reasonable skill in the art should recognize well-known methods for forming the dielectric barrier 326 on the reference plane 316.

The dielectric barrier layer 326 is opened on one side of the discontinuity 330 to expose a portion of the reference plane 316. The opening 328 might have a variety of shapes depending, e.g., on the process or type of equipment (e.g., laser) used to create it. The opening might be slotted or created using vias. A person of reasonable skill in the art should recognize a variety of processes and equipment to create the opening 328 in a variety of well-known shapes including drilling blind or buried vias, laser drilling vias or slots, or photodefining openings on dielectric materials such as curable liquid epoxies or solder masks.

A conductive layer 332 spanning the length and width of the discontinuity 330 is formed on the dielectric layer 326. The conductive layer 332 includes a first portion 338 connecting the conductive layer 332 to the reference plane 316 through the opening 328. A second portion 336 bridges or spans the discontinuity 330. A third portion 334 extends across the reference plane 316 on another side of the discontinuity 330 as shown in FIG. 3. Unlike the first portion 338, the third portion 334 remains disconnected from reference plane 316. In other words, the conductive layer 332 is electrically connected to the reference plane 316 at one end through the opening 328.

The conductive layer 332 increases AC signal coupling between the signal layers and underlying reference planes. The conductive layer 332, therefore, improves signal strength over a broad frequency spectrum without requiring additional components, e.g., stitching capacitors. The conductive layer 332 minimizes EMC and SI problems relaxing CB signal routing constraints, improving CB surface area usage, and reducing component cost.

The conductive layer 332 might be a carbon material, e.g., graphite or carbon black. A person of reasonable skill in the art should recognize other suitable materials for the conductive layer 332 including conductive materials not necessarily including carbon. The conductive layer 332 might be deposited on the CB using a variety of well-known commercial processes, e.g., processes available to deposit carbon materials to enhance adhesion for electroless copper plating of vias. The conductive properties of carbon along with the ability to apply them in very thin layers (e.g., <1 mil thick), lend themselves to improve coupling across plane discontinuities as described herein.

A pre-preg epoxy layer 314, the signal layers 312 and 324, and solder mask 340 and 342 complete the CB stack up. A person of reasonable skill in the art should recognize well-known methods of forming the pre-preg layers 314, the signal layers 312 and 324, and the solder masks 340 and 342.

Figure 5:
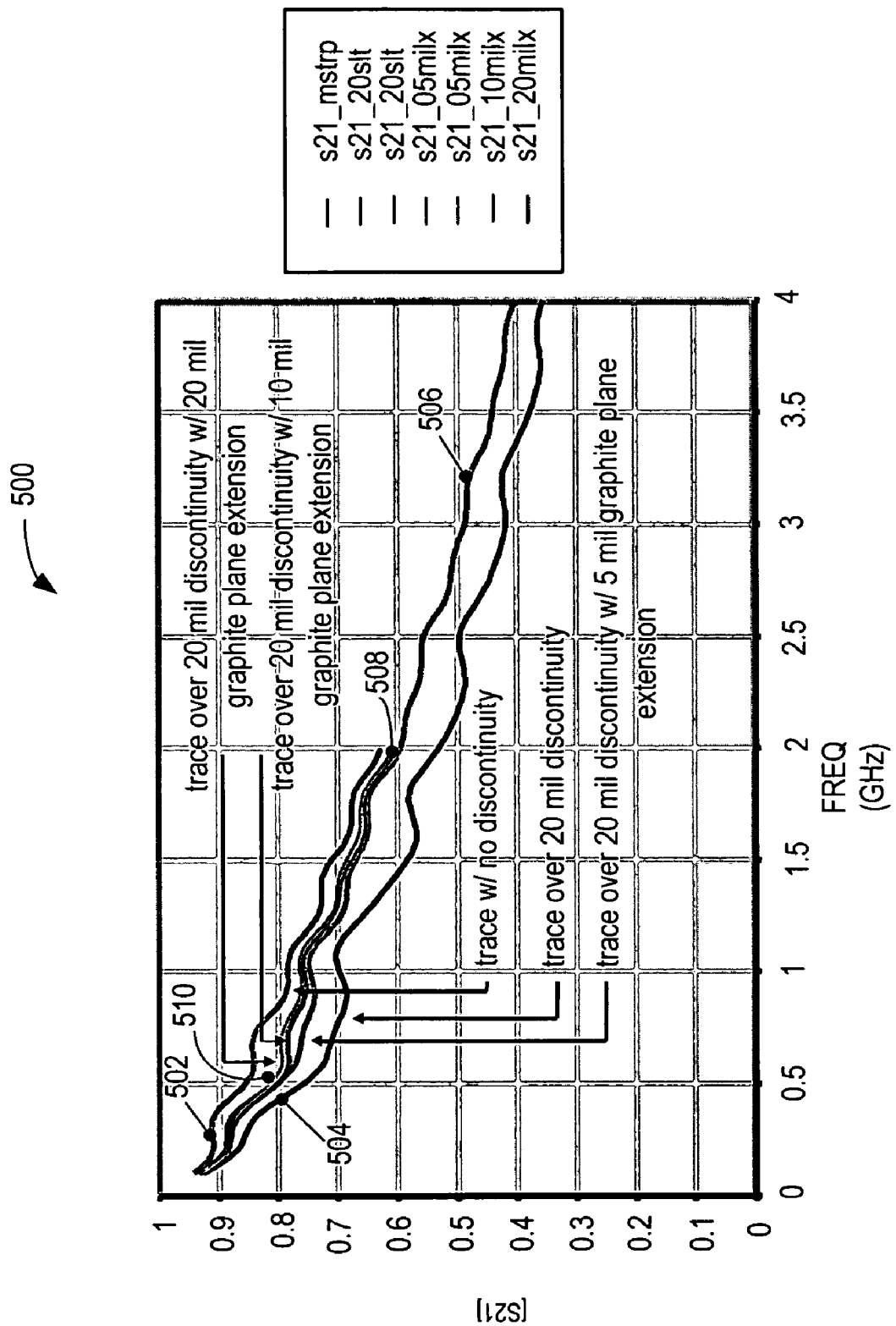
FIG. 5 is a simulation graph of the CB shown in FIG. 3.

FIG. 5 is a graph of simulation results 500 for the CB shown in FIG. 3. Referring to FIGS. 3 and 5, the graph lines show results of using graphite for the conductive layer 332. The discontinuity 330 is 20 mils wide by 2300 mils long. The reference plane 316 is made of 1-ounce copper. The reference plane 316 and the ground plane 320 are separated by a core 318 being 1.6 mils wide of 1060 FR4 pre-preg.

The graph lines in FIG. 5 are bounded on the one end, by simulation results of a signal trace 502 with no underlying discontinuity and, on the other end, by a signal trace 504 with a 20-mil discontinuity but no conductive layer 332 added to the CB. The signals traces 506, 598, and 510 refer to traces over a 20-mil discontinuity with a conductive layer 332 interposed as shown in FIG. 3. Trace 506 refers to a conductive layer 332 having its third portion 334 extend over the discontinuity by 5 mils. Trace 508 refers to a conductive layer 332 having its third portion 334 extend over the discontinuity by 10 mils. And trace 510 refers to a conductive layer 332 having its third portion 334 extend over the discontinuity by 20 mils.

The simulation results shown in FIG. 5 indicate that a CB including a conductive layer 332 increases the signal strength across the discontinuity by 10-15% over a 100 to 4,000 MHz frequency band. A person of reasonable skill in the art should understand the results shown in FIG. 5 are merely exemplary.

Having illustrated and described the principles of our invention, it should be readily apparent to those skilled in the art that the invention can be modified in arrangement and detail without departing from such principles. We claim all modifications coming within the spirit and scope of the accompanying claims.

We claim:

1. A method of manufacturing a circuit board, comprising:
   defining a discontinuity in a voltage reference plane;
   applying a dielectric barrier over the voltage reference plane extending across the discontinuity;
   applying a carbon material over the dielectric barrier such that the carbon material extends from one end of the discontinuity to another end of the discontinuity, the carbon material being electrically connected to the reference plane at the one end;
   applying an insulating layer over the carbon material; and
   applying a signal line extending across the discontinuity, the signal line applied over the insulating layer.

2. The method of claim 1 wherein defining a discontinuity includes defining at least one of a split, a slot, and a cutout.

3. The method of claim 1 comprising:
   opening the dielectric barrier at the one end of the discontinuity;
   wherein applying the carbon material comprises applying the carbon material in the opening of the dielectric barrier and extending across the discontinuity.

4. The method of claim 3 wherein opening the dielectric barrier includes opening the dielectric barrier at one end of the discontinuity with a laser.

5. The method of claim 3 wherein:
   opening the dielectric barrier includes opening the dielectric barrier at one end of the discontinuity with vias; and
   applying the carbon material includes filling the vias with the carbon material.

6. The method of claim 1 wherein applying a carbon material includes applying graphite.

7. The method of claim 1 wherein applying a carbon material includes applying carbon black.

8. The method of claim 1 wherein applying the carbon material over the dielectric barrier comprises applying the carbon material such that it overlaps all of the discontinuity.

9. The method of claim 1, wherein applying the dielectric barrier over the voltage reference plane comprises filling the discontinuity with the dielectric barrier.

10. The method of claim 1, wherein the signal line is not electrically connected to either the carbon material or the voltage reference plane.

11. The method of claim 1, wherein the signal line and the voltage reference layer form a transmission line.

12. The method of claim 11, wherein the transmission line is a microstrip transmission line.

13. The method of claim 1, further comprising:
    forming a second signal line in the discontinuity, the second signal electrically disconnected from the voltage reference plane;
    wherein:
        applying the dielectric barrier comprises applying the dielectric barrier over the second signal line; and
        applying the carbon material comprises applying the carbon material over the dielectric barrier over the second signal line.

14. A method of manufacturing a circuit board, comprising:
    forming a continuous voltage reference layer except for at least one discontinuity, the at least one discontinuity to route signals from one signal layer to another;
    forming a signal line which extends across the at least one discontinuity; and
    disposing a conductive layer between the signal line and the voltage reference layer and extending across the at least one discontinuity, the conductive layer being electrically coupled to the reference layer only at one end of the at least one discontinuity and not electrically coupled to the signal line.

15. The method of claim 14 wherein forming the voltage reference layer includes forming a split dividing the voltage reference layer in to first and second electrically isolated portions as the at least one discontinuity.

16. The method of claim 14 wherein forming the voltage reference layer includes forming a slot surrounded on all sides by the voltage reference layer as the at least one discontinuity.

17. The method of claim 14 wherein forming the voltage reference layer includes forming a cutout surrounded on all sides by the voltage reference layer as the at least one discontinuity.

18. The method of claim 14 wherein disposing the conductive layer includes electrically coupling the conductive layer to only the voltage reference layer.

19. The method of claim 18 wherein disposing the conductive layer includes coupling the conductive layer to the voltage reference layer at the one end with a slot.

20. The method of claim 18 wherein disposing the conductive layer includes coupling the conductive layer to the voltage reference layer at the one end with a via.

21. The method of claim 14, wherein disposing the conductive layer includes:
    forming a first portion overlapping the reference layer at one side of the at least one discontinuity, the first portion being directly coupled to the reference layer;
    forming a second portion overlapping the reference layer at another side of the at least one discontinuity, the second portion being not directly coupled to the reference layer or the first portion; and
    forming a third portion spanning the at least one discontinuity, the third portion directly coupled to the first portion and the second portion.

* * * * *